(12) United States Patent
Chen

(10) Patent No.: US 11,137,266 B2
(45) Date of Patent: Oct. 5, 2021

(54) ELECTRIC METER MONITORING DEVICE AND ELECTRIC POWER MONITORING SYSTEM

(71) Applicant: Ming-Tsung Chen, Taipei (TW)

(72) Inventor: Ming-Tsung Chen, Taipei (TW)

(*) Notice: Subject to any disclaimer, the term of this patent is extended or adjusted under 35 U.S.C. 154(b) by 337 days.

(21) Appl. No.: 16/198,813

(22) Filed: Nov. 22, 2018

(65) Prior Publication Data

US 2020/0033158 A1 Jan. 30, 2020

Related U.S. Application Data

(60) Provisional application No. 62/711,649, filed on Jul. 30, 2018.

(51) Int. Cl.
*G01D 4/00* (2006.01)
*G01R 19/25* (2006.01)

(52) U.S. Cl.
CPC ......... *G01D 4/004* (2013.01); *G01R 19/2513* (2013.01)

(58) Field of Classification Search
CPC ..................................................... G01D 4/004
USPC ....................................................... 702/61
See application file for complete search history.

(56) References Cited

U.S. PATENT DOCUMENTS

| | | | | |
|---|---|---|---|---|
| 5,140,351 A | * | 8/1992 | Garcia | G01F 15/06 385/117 |
| 6,188,145 B1 | * | 2/2001 | Stewart | H02J 7/007 307/125 |
| 2005/0206530 A1 | * | 9/2005 | Cumming | G01R 22/063 340/870.02 |
| 2010/0043870 A1 | * | 2/2010 | Bennett | H02S 40/34 136/251 |
| 2011/0004357 A1 | * | 1/2011 | Mathiowetz | H02J 3/387 700/295 |
| 2013/0013257 A1 | * | 1/2013 | Yamakawa | G05B 23/0208 702/183 |
| 2014/0160297 A1 | * | 6/2014 | Dondurur | G01D 4/006 348/160 |

* cited by examiner

*Primary Examiner* — Ricky Go
(74) *Attorney, Agent, or Firm* — Li & Cai Intellectual Property (USA) Office

(57) ABSTRACT

An electric meter monitoring device and an electric power monitoring system are provided. An image capturing module is disposed at a side opposite to an electric power consumption display module of an electric meter to capture an electric power consumption image of the electric power consumption display module. A clamp meter module clamps on at least one electric wire to detect a value of a current flowing through the at least one electric wire. A temperature humidity meter module detects a temperature value and a humidity value around the electric meter. A control module transmits an electric power consumption value, a current value, the temperature value and the humidity value to a server through a communication module.

5 Claims, 2 Drawing Sheets

ELECTRIC METER MONITORING DEVICE AND ELECTRIC POWER MONITORING SYSTEM

CROSS-REFERENCE TO RELATED PATENT APPLICATION

This application claims priority from the U.S. Provisional Patent Application Ser. No. 62/711,649 filed on Jul. 30, 2018, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electric meter monitoring device and an electric power monitoring system, and more particularly to an electric meter monitoring device and an electric power monitoring system without changing wires of the electric meter.

BACKGROUND OF THE DISCLOSURE

Although smart electric meters are becoming popular, conventional electric meters are still commonly used. Since the wires of the electric meter can only be changed by certified electric suppliers, it is difficult for users to get instant information related to purchasing or selling electricity if the users want to use green energy (such as solar energy) to increase the electricity allowance or sell green energy.

Therefore, it has become an important issue in the art to provide an easy-to-use and easy-to-install electric meter monitoring device or electric power monitoring system.

SUMMARY OF THE DISCLOSURE

In response to the above issues, the present disclosure provides an electric meter monitoring device and an electric power monitoring system.

In one aspect, the present disclosure provides an electric meter monitoring device for monitoring an electric meter. The electric meter includes at least one electric wire and an electric power consumption display module. The electric meter monitoring device includes: a control module, an image capturing module, a clamp meter module, a temperature humidity module, a communication module, and a power module. The image capturing module is electrically connected to the control module. The image capturing module is disposed at a side opposite to the electric power consumption display module of the electric meter for capturing an electric power consumption image of the electric power consumption display module, and the electric power consumption image captured by the image capturing module is transmitted to the control module for identification to obtain an electric power consumption value. The clamp meter module is electrically connected to the control module, and clamped on the at least one electric wire for detecting a value of a current flowing through the at least one electric wire. The temperature humidity module is electrically connected to the control module for detecting a temperature value and a humidity value around the electric meter. The communication module is electrically connected to the control module. The control module transmits the electric power consumption value, the current value, the temperature value and the humidity value to the server through the communication module. The power module is electrically connected to the control module for providing the electric monitoring device with electrical energy. The server determines an electrical power supply state parameter according to the electric power consumption value, the current value, the temperature value, and the humidity value, and the server determines the off/on state of an electric power switch.

In one aspect, the present disclosure provides an electric power monitoring system disposed in a predetermined area. The predetermined area is provided with at least one electronic device, and further provided with a solar energy conversion module. The electric power monitoring system includes: a purchased electricity meter electrically connected to an electrical grid system and the electronic device, a sold electricity meter electrically connected to the electrical grid system, a first electric meter monitoring device, a second electric meter monitoring device, and a server. The first electric meter monitoring device is adjacent to the purchased electricity meter for obtaining a purchased electricity value and a purchased electric current value of the purchased electricity meter, a temperature value and a humidity value around the purchased electricity meter. The second electric meter monitoring device is adjacent to the sold electricity meter for obtaining a sold electricity value and a sold electric current value of the sold electricity meter and a temperature value and a humidity value around the sold electricity meter. The first electric meter monitoring device provides the purchased electricity value and the purchased electric current value of the purchased electricity meter, the temperature value and the humidity value around the purchased electricity meter to the server, and the second electric meter monitoring device provides the sold electricity value and the sold electric current value of the sold electricity meter and the temperature value and the humidity value around the sold electricity meter to the server. According to the purchased electricity value and the purchased electric current value of the purchased electricity meter, the temperature value and the humidity value around the purchased electricity meter to the server, the sold electricity value and the sold electric current value of the sold electricity meter and the temperature value and the humidity value around the sold electricity meter, the server respectively determines a purchased electricity supply state parameter and a sold electricity supply state parameter, and according to the purchased electricity supply state parameter and the sold electricity supply state parameter, the server determines the off/on state of an electric power switch.

Therefore, the electric meter monitoring device of the present disclosure can be installed without changing the wires of the electric meter and can effectively monitor the use and generation of electrical energy so that the installation cost and the manpower cost can be reduced. Furthermore, the electric power monitoring system of the present disclosure can rapidly provide a convenient access to electricity consumption information through a combination of monitoring the electrical energy changes of the electric power circuits of the purchased electricity meter and the sold electricity meter, and calculation of cloud servers.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
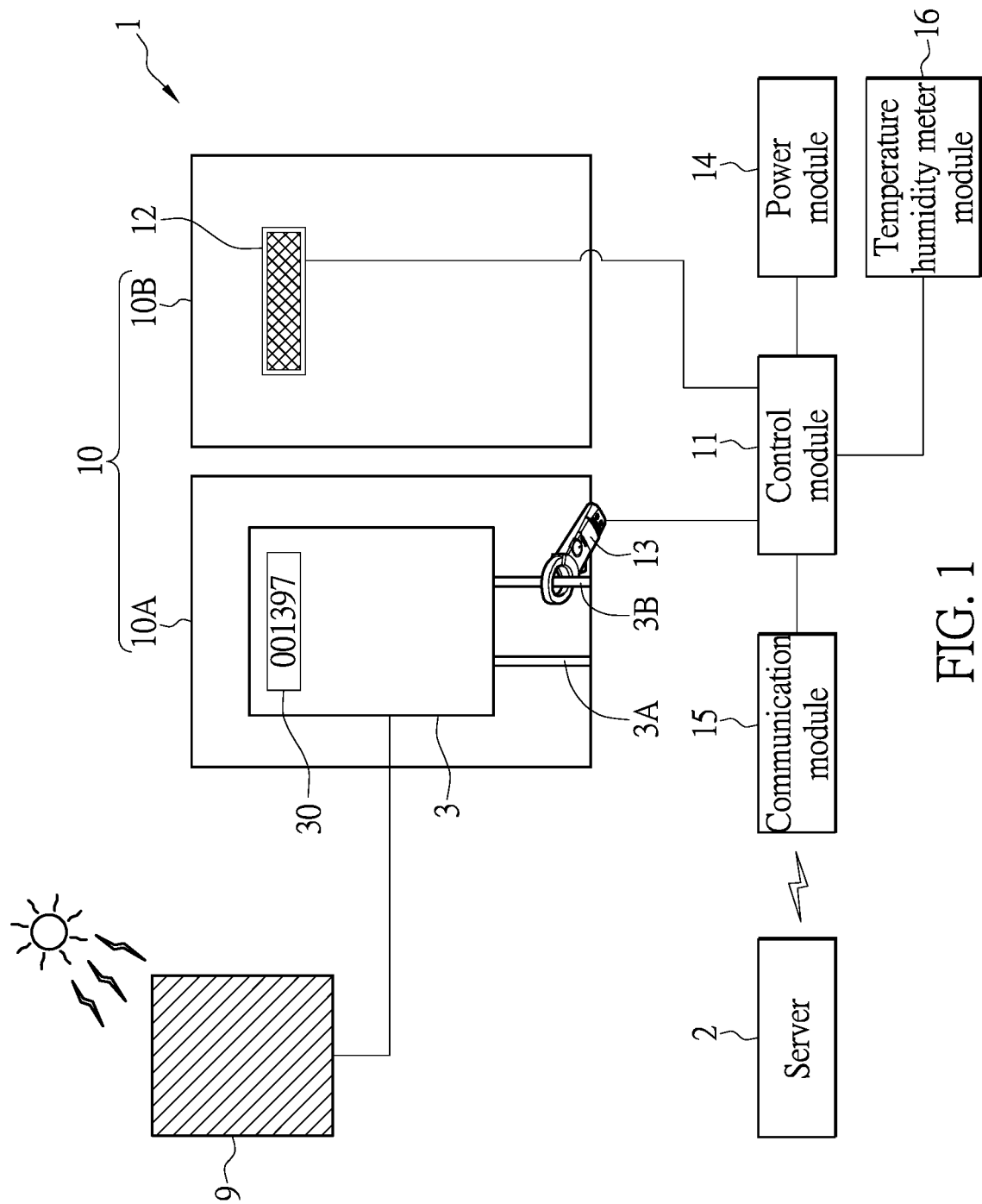
FIG. 1 is a schematic view of an electric meter monitoring device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure will be described below in conjunction with the drawings in at least one embodiment. However, the following embodiments are not intended to limit the present disclosure. In the following descriptions, regarding an electronic component having two or more end points, if there is a special mark, the foot mark serves as the foot description. Regarding the electronic component having two end points and disposed laterally, if there is no special mark, the left end point is the first end, and the right end is the second end. Regarding the electronic components having two end points and vertically disposed, the upper end is the first end, and the lower end is the second end.

Referring to FIG. 1, FIG. 1 is a schematic view of an electric meter monitoring device according to an embodiment of the present disclosure.

In this embodiment, an electric meter monitoring device 1 is used to monitor an electric meter 3. The electric meter 3 includes at least two electric wires 3A and 3B and an electric power consumption display module 30.

The electric meter monitoring device 1 includes a control module 11, an image capturing module 12, a clamp meter module 13, a power module 14, a communication module 15 and a temperature humidity meter module 16. In this embodiment, the control module 11 is electrically connected to the image capturing module 12, the clamp meter module 13, the power module 14, the communication module 15 and the temperature humidity meter module 16.

The image capturing module 12 is electrically connected to the control module 11, and the image capturing module 12 corresponds to the electric power consumption display module 30 of the electric meter 3 in position and is disposed at a side opposite to the electric power consumption display module 30 of the electric meter 3 for capturing an electric power consumption image of the electric power consumption display module 30. The electric power consumption image captured by the image capturing module 12 is transmitted to the control module 11 for identification to obtain an electric power consumption value.

In this embodiment, the image capturing module 12 is a charge-coupled device (CCD). That is, the image capturing module 12 corresponds to the electric power consumption display module 30 of the electric meter 3 in position and is disposed at a side opposite to the electric power consumption display module 30 for directly capturing an electric power consumption image of the electric power consumption display module 30.

The clamp meter module 13 is electrically connected to the control module 11. The clamp meter module 13 is clamped on the electric wire 3A or the electric wire 3B of the electric meter 3. In this embodiment, the clamp meter module 13 is clamped on the electric wire 3B for detecting a value of a current flowing through the electric wire 3B. The configurations of the electric meter 3 and the electric wire 3B should be inspected by a certificate authority, and a galvanometer cannot be configured in the circuitry of the electric meter 3 without authorization. Therefore, the electric meter monitoring device 1 obtains a live current value when a current flows through the electric meter 3. In this embodiment, the clamp meter module 13 is a clamp sensor. That is, the clamp meter module 13 obtains the current value when the current flows through the electric meter 3 by electromagnetic induction.

The temperature humidity meter module 16 is electrically connected to the control module 11 for detecting a temperature value and a humidity value around the electric meter 3.

The communication module 15 is electrically connected to the control module 11. The control module 11 transmits the electric power consumption value, the current value, a sunshine value, the temperature value and the humidity value around the electric meter 3 to a server 2 through the communication module 15 by using at least one communication protocol (such as Sigfox, LoRa, 4G).

The server 2 determines an electrical power supply state parameter according to the electric power consumption value, the current value, the temperature value and the humidity value.

In this embodiment, a solar energy conversion device 9 generally has an optimum operating temperature of 25° C. with output performance of 100%. However, when the operating temperature is higher than 25° C., the output performance of the solar energy conversion device 9 decreases, for example, when the operating temperature is 35° C., the output performance may decrease to 90%. Therefore, the server 2 can analyze and predict the performance of the solar energy conversion device 9 according to a temperature and humidity around the solar energy conversion device 9.

When the server 2 detects that the electric power consumption value outputted by the solar energy conversion device 9 greatly reduces, it may result from several situations. If the ambient temperature, humidity, solar irradiance, and airflow are in the normal range, the solar energy conversion device 9 would be determined to have malfunctioned.

Further, if the ambient temperature, humidity, solar irradiance, and airflow are abnormal, it can be determined that the environmental factors cause the solar energy conversion device 9 to be abnormal.

In the above circumstances, the server 2 estimates the percentages of the performance of the solar energy conversion device 9 based on different environmental factors to predict the best transaction price of electrical energy of the day. Several examples of determination are shown as follows.

A. With normal temperature, high humidity, low sunshine, the server 2 determines the environment as: cloudy or rainy. Further, compared with the weather satellite images obtained from the Internet, the server 2 can predict the affected areas, the affected time slots, and the total output performance of the solar energy conversion device 9 affected by the weather so as to predict a transaction price of generated green energy.
  B. With normal temperature, high humidity, high sunshine, the server 2 determines the environment as: being going to rain. Further, compared with the weather satellite images obtained from the Internet, the server 2 can predict the affected areas, the affected time slots, and the total output performance of the solar energy conversion device 9 affected by the weather. Furthermore, the server 2 can also determine whether it is appropriate to send staff for routine maintenance in the mountains or there may have lightning strikes in the mountains.
  C. With low temperature, normal humidity, high sunshine, the server 2 determines the environment as normal. At this time, if the power output decreases, the server 2 determines that the output of the solar energy conversion device 9 is abnormal.

In this embodiment, the communication module 15 may be a WiFi communication module, a Bluetooth communication module, a Sigfox communication module or a LoRa communication module, which can be adjusted or designed according to actual requirements, and is not limited in the present disclosure.

The power module 14 is electrically connected to the control module 11 for providing the control module 11, the image capturing module 12, the clamp meter module 13, the communication module 15 and the temperature humidity meter module 16 of the electric monitoring device 1 with electrical energy. Since the change of the electric meter 3 should be real-time and long-term monitored, in this embodiment, the power module 14 is an uninterruptible power system (UPS). In other embodiments, the power module 14 may be a long-lasting battery.

In other embodiments, the electric meter 3 is electrically connected to the solar energy conversion device 9 used to convert solar energy to electrical energy. That is, the electric meter 3 can be an electric meter for monitoring renewable energy or green energy. The user can use the electric meter monitoring device 1 not only to monitor the electrical energy generated by the electric meter 3 though the solar energy conversion device 9, but to monitor whether an excessive amount of power is sold. In this embodiment, the server 2 determines the off/on state of an electric power switch according to the electrical power supply state parameter to determine whether the electrical energy generated by the solar energy conversion device 9 should be sold or stored in an energy storage device (not shown).

In this embodiment, the electric meter 3 is disposed in a case 10, and the case 10 includes a main body 10A and an outer cover 10B. The electric meter 3 is disposed in the main body 10A, and the image capturing module 12 corresponds to the electric power consumption display module 30 of the electric meter 3 in position, and is disposed on the outer cover 10B opposite to the electric power consumption display module 30 of the electric meter 3. Further, the control module 11, the communication module 15, the power module 14 are also disposed in the main body 10A of the case 10.

Figure 2:
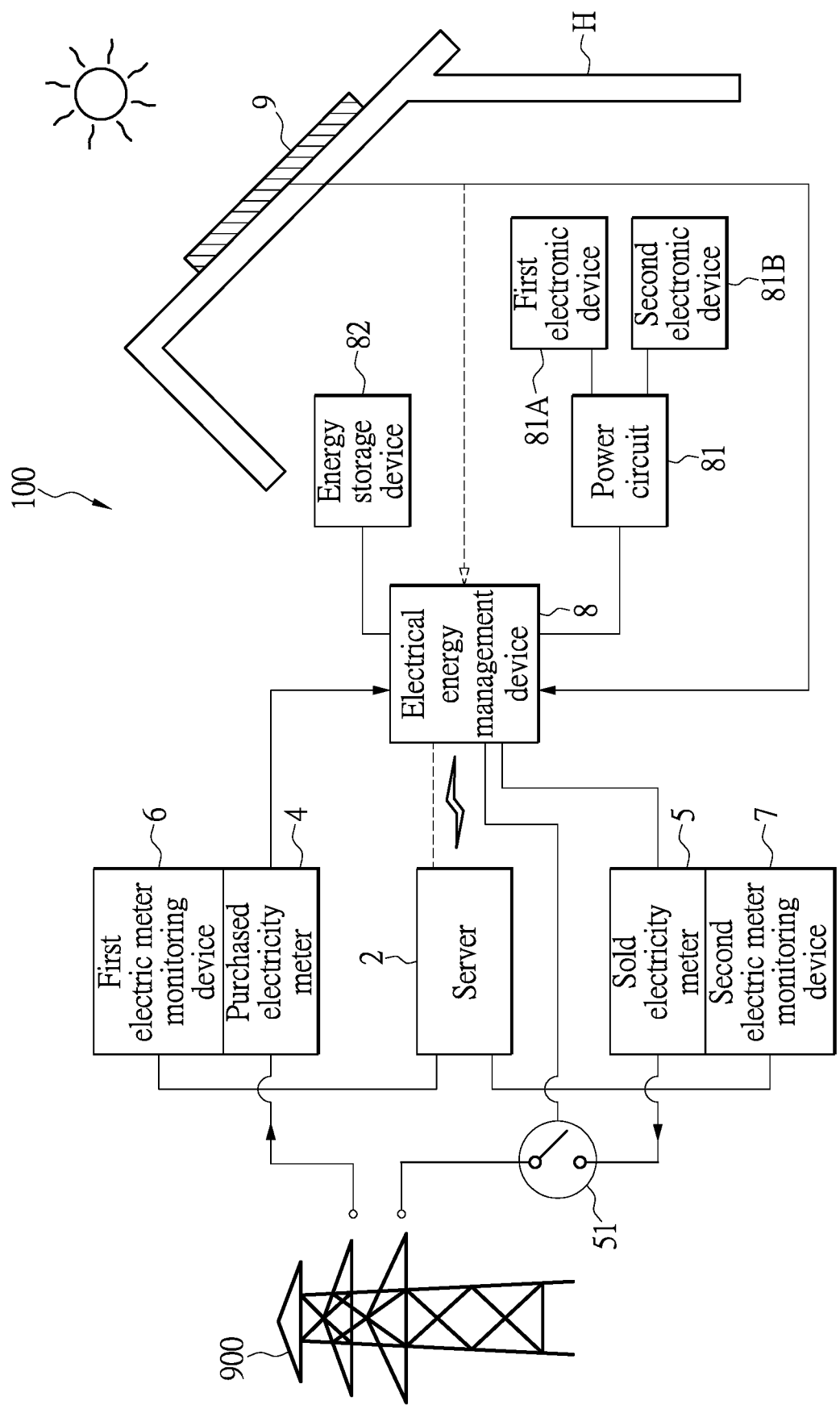
FIG. 2 is a schematic view of an electric power monitoring system according to an embodiment of the present disclosure.

Referring to FIG. 2, FIG. 2 is a schematic view of an electric power monitoring system according to an embodiment of the present disclosure.

In this embodiment, an electric power monitoring system 100 is disposed in a predetermined area H, that is, in a home area. In other embodiments, the electric power monitoring system 100 can be disposed in different areas according to actual needs, which is not limited in the present disclosure.

The predetermined area H is at least disposed with a first electronic device 81A and a second electronic device 81B. In addition, the predetermined area H is further provided with the solar energy conversion device 9.

The electric power monitoring system 100 includes the server 2, a purchased electricity meter 4, a sold electricity meter 5, a first electric meter monitoring device 6, a second electric meter monitoring device 7, an electrical energy management device 8 and the solar energy conversion device 9.

In this embodiment, the electric power monitoring system 100 includes the purchased electricity meter 4 and the sold electricity meter 5. That is, in the predetermined area H, the consumed electrical energy and the sold electrical energy are calculated by an electric meter respectively, and electrical power circuits of the purchased electricity and the sold electricity do not interfere with each other.

The purchased electricity meter 4 is electrically connected to an electrical grid system 900 and the electrical energy management device 8. The electrical energy management device 8 is electrically connected to a power circuit 81. The power circuit 81 is electrically connected to the first electronic device 81A and the second electronic device 81B.

The electrical energy management device 8 is further electrically connected to the electrical grid system 900.

The first electric meter monitoring device 6 is adjacent to the purchased electricity meter 4 for obtaining a purchased electricity value and a sold electric current value of the purchased electricity meter 4 and a temperature value and a humidity value around the purchased electricity meter 4.

The second electric meter monitoring device 7 is adjacent to the sold electricity meter 5 for obtaining a sold electricity value and a sold electric current value of the sold electricity meter 5 and a temperature value and a humidity value around the sold electricity meter 5.

In this embodiment, the first electric meter monitoring device 6 and the second electric meter monitoring device 7 respectively obtain the purchased electricity value, the purchased electric current value of the purchased electricity meter 4, and the sold electricity value, the sold electric current value of the sold electricity meter 5.

Since the first electric meter monitoring device 6 and the second electric meter monitoring device 7 have the same structure and functions as the electric meter monitoring device 1, the descriptions thereof will be omitted therein.

The first electric meter monitoring device 6 provides the purchased electricity value and the purchased electric current value of the purchased electricity meter 4, and the temperature value and the humidity value around the purchased electricity meter 4 to the server 2. The second electric meter monitoring device 7 provides the sold electricity value and the sold electric current value of the sold electricity meter 5, and the temperature value and the humidity value around the sold electricity meter 5 to the server 2.

According to the purchased electricity value and the purchased electric current value of the purchased electricity meter 4, and the temperature value and the humidity value around the purchased electricity meter 4 provided by the first electric meter monitoring device 6, and the sold electricity value and the sold electric current value of the sold electricity meter 5, and the temperature value and the humidity value around the sold electricity meter 5 provided by the second electric meter monitoring device 7, the server 2 can further analyze various electric-related parameters, such as: a price for purchased electricity, a price for sold electricity, carbon emissions, analyses of environmental parameters, power consumption curves.

In this embodiment, the electrical energy generated by the solar energy conversion device 9 is sold to the electrical grid system 900 or stored in an energy storage device 82.

In this embodiment, the electric power monitoring system 100 further includes a display device (not shown). The display device (not shown) can be connected to the server 2 through a direct electrical connection or a communication connection, so as to display the purchased electricity value and the purchased electric current value of the purchased electricity meter 4, and the temperature value and the humidity value around the purchased electricity meter 4 provided by the first electric meter monitoring device 6, and the sold electricity value and the sold electric current value of the sold electricity meter 5, and the temperature value and the humidity value around the sold electricity meter 5 provided by the second electric meter monitoring device 7 stored in the server 2 though the display device (not shown).

According to the purchased electricity value and the purchased electric current value of the purchased electricity meter 4, and the temperature value and the humidity value around the purchased electricity meter 4 provided by the first electric meter monitoring device 6, and the sold electricity value and the sold electric current value of the sold electricity meter 5, and the temperature value and the humidity value around the sold electricity meter 5 provided by the second electric meter monitoring device 7, the server 2 respectively determines a purchased electricity supply state parameter and a sold electricity supply state parameter. According to the purchased electricity supply state parameter and the sold electricity supply state parameter, the server 2 determines the off/on state of an electric power switch 51. In this embodiment, the electric power switch 51 can determine whether the electrical energy generated by the solar energy conversion device 9 should be sold. When the electric power switch 51 is turned on (in an open circuit), the electrical energy generated by the solar energy conversion device 9 cannot be sold. When the electric power switch 51 is turned off (in a short circuit), the electrical energy generated by the solar energy conversion device 9 will be sold.

In other embodiments, the user can also use a mobile device, such as a mobile phone, a tablet, a wearable device, to communicate with the server 2 so as to obtain the various parameters described above.

In summary, the electric meter monitoring device according to the present disclosure can be installed without changing the wires of the electric meter, and can effectively monitor the use and generation of electrical energy so that the installation cost and the manpower cost can be reduced. Furthermore, the electric power monitoring system of the present disclosure can rapidly provide users with a convenient access to electricity consumption information through a combination of monitoring the electrical energy changes of the electric power circuits of the purchased electricity meter and the sold electricity meter, and calculation of cloud servers.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electric meter monitoring device for monitoring an electric meter including at least one electric wire and an electric power consumption display module, the electric meter monitoring device comprising:
    a control module;
    an image capturing module electrically connected to the control module, wherein the image capturing module is disposed at a side opposite to the electric power consumption display module of the electric meter for capturing an electric power consumption image of the electric power consumption display module, and the electric power consumption image captured by the image capturing module is transmitted to the control module for identification to obtain an electric power consumption value;
    a clamp meter module electrically connected to the control module, and being clamped on the at least one electric wire for detecting a value of a current flowing through the at least one electric wire;
    a temperature humidity module electrically connected to the control module for detecting a temperature value and a humidity value around the electric meter;
    a communication module electrically connected to the control module, wherein the control module transmits the electric power consumption value, the current value, the temperature value and the humidity value to a server through the communication module; and
    a power module electrically connected to the control module for providing the electric monitoring device with electrical energy;
    wherein the server determines an electrical power supply state parameter according to the electric power consumption value, the current value, the temperature value, and the humidity value, and the server determines the off/on state of an electric power switch;

wherein the electric meter is disposed in a case, the case includes a main body and an outer cover, the electric meter is disposed in the main body, the image capturing module is disposed on the outer cover opposite to the electric power consumption display module of the electric meter.

2. The electric meter monitoring device according to claim 1, wherein the electric meter is electrically connected to a solar energy conversion device.

3. The electric meter monitoring device according to claim 1, wherein the power module is an uninterruptible power system.

4. The electric meter monitoring device according to claim 1, wherein the clamp meter module is a clamp sensor.

5. The electric meter monitoring device according to claim 1, wherein the control module, the communication module, the power module are disposed in the main body of the case.

\* \* \* \* \*